United States Patent
Hsieh et al.

(10) Patent No.: US 11,656,980 B2
(45) Date of Patent: May 23, 2023

(54) EXTENSIBLE MEMORY DUAL INLINE MEMORY MODULE

(71) Applicant: Lenovo Enterprise Solutions (Singapore) Pte. Ltd., New Tech Park (SG)

(72) Inventors: Yu-Wei Hsieh, Beijing (CN); Po Chia Chen, Beijing (CN); Li-Ping Zhang, Beijing (CN); Tai Wei Hsia, Beijing (CN)

(73) Assignee: Lenovo Enterprise Solutions (Singapore) Pte. Ltd., New Tech Park (SG)

( * ) Notice: Subject to any disclaimer, the term of this patent is extended or adjusted under 35 U.S.C. 154(b) by 65 days.

(21) Appl. No.: 17/067,578

(22) Filed: Oct. 9, 2020

(65) Prior Publication Data

US 2021/0109849 A1 Apr. 15, 2021

(51) Int. Cl.
*G06F 12/02* (2006.01)
*G06F 3/06* (2006.01)
*G11C 5/04* (2006.01)

(52) U.S. Cl.
CPC .......... *G06F 12/023* (2013.01); *G06F 3/0685* (2013.01); *G11C 5/04* (2013.01); *G06F 2212/205* (2013.01)

(58) Field of Classification Search
None
See application file for complete search history.

(56) References Cited

U.S. PATENT DOCUMENTS

| | | | | |
|---|---|---|---|---|
| 10,877,916 | B2* | 12/2020 | Das Sharma | G06F 13/4022 |
| 2008/0016269 | A1* | 1/2008 | Chow | G06F 13/1684 |
| | | | | 711/103 |
| 2008/0077732 | A1* | 3/2008 | Risse | G06F 13/1684 |
| | | | | 711/E12.083 |
| 2009/0254689 | A1* | 10/2009 | Karamcheti | G06F 16/2455 |
| | | | | 707/E17.014 |
| 2013/0151745 | A1* | 6/2013 | Yin | G06F 1/189 |
| | | | | 710/301 |
| 2014/0201314 | A1* | 7/2014 | Borkenhagen | G06F 11/1666 |
| | | | | 709/216 |
| 2016/0342343 | A1* | 11/2016 | Yen | G06F 12/02 |
| 2017/0160956 | A1* | 6/2017 | Chinnakkonda Vidyapoornachary | G06F 11/0793 |
| 2018/0081554 | A1* | 3/2018 | Iyer | G11C 8/12 |

(Continued)

*Primary Examiner* — William E. Baughman
(74) *Attorney, Agent, or Firm* — Kunzler Bean & Adamson

(57) ABSTRACT

Disclosed herein is an extensible memory subsystem comprising a dual in-line memory module (DIMM) that includes a dynamic random-access memory (DRAM) having a basic memory space, a DIMM memory controller coupled to the DRAM, a memory interface configured to couple the DIMM to a DIMM connector of a computing device, and a first extension interface configured to couple the DIMM to a first remote memory module having a first remote memory space, wherein the DIMM memory controller is configured to map a DIMM memory space comprising the basic memory space of the DRAM and the first remote memory space of the first remote memory module, the DIMM memory space being accessible by the computing device upon the DIMM being coupled to the computing device via the memory interface, and a first remote memory module coupled to the DIMM via the first extension interface of the DIMM.

20 Claims, 15 Drawing Sheets

(56) References Cited

U.S. PATENT DOCUMENTS

2018/0150240 A1* 5/2018 Bernat ................. G06F 3/0613
2019/0018813 A1* 1/2019 Das Sharma ......... G06F 13/404
2019/0196725 A1* 6/2019 Lendvay ................ G06F 3/065

* cited by examiner

EXTENSIBLE MEMORY DUAL INLINE MEMORY MODULE

TECHNICAL FIELD

The present application relates to an extensible memory, and more specifically to an extensible memory dual inline memory module for an extensible memory subsystem.

BACKGROUND

The memory of a computing device is usually limited by physical space constraints. For example, because of the limited room on the mainboard of the computing device, only a fixed number of memory dual inline memory module (DIMM) sockets/slots can be accommodated on the mainboard. Once all the memory DIMM sockets/slots have one memory DIMM plugged into each of the memory DIMM sockets/slots, the memory subsystem of the computing device would have been "expanded" to its maximum capacity. Thus, typical proposals for increasing the memory subsystem capacity have been directed toward increasing the memory capacity of each memory chip on a memory DIMM. Unfortunately, even if new generations of memory DIMMs with larger memory capacities are later available, the computing device may not be able to accommodate a mix of heterogenous types of memory DIMMs. Essentially, the user has to put up with a limited system memory capacity, and accordingly make do with less than optimal computing performance from the computing device.

SUMMARY

According to one aspect, the present disclosure provides an extensible dual in-line memory module (DIMM) including: a dynamic random-access memory (DRAM) having a basic memory space; a DIMM memory controller coupled to the DRAM; a memory interface configured to couple the DIMM to a DIMM connector of a computing device; and a first extension interface configured to couple the DIMM to a first remote memory module having a first remote memory space, wherein the DIMM memory controller is configured to map a DIMM memory space comprising the basic memory space of the DRAM and the first remote memory space of the first remote memory module, the DIMM memory space being accessible by the computing device upon the DIMM being coupled to the computing device via the memory interface.

Optionally, the DIMM as described above, in which the DIMM memory controller is further configured to use a first address to map to a second address, wherein the first address is defined with respect to the DIMM memory space, and wherein the second address is defined with respect to the first remote memory space.

According to another aspect, the present disclosure provides an extensible memory subsystem including: a dual in-line memory module (DIMM) as described above; and a first remote memory module coupled to the DIMM via the first extension interface of the DIMM.

The extensible memory subsystem may be configured such that the first remote memory module further includes: a first remote memory controller configured to define a first remote memory space, the first remote memory controller being further configured to use a second address to map to a third address, wherein the second address is determined with respect to the first remote memory space and wherein the second address is converted from the first address by the DIMM memory controller.

Optionally, the extensible memory subsystem may be configured such that the DIMM further comprises a DIMM memory controller, the DIMM memory controller being configured to provide a memory map, the memory map aggregating the first remote memory space with the basic memory space.

The extensible memory subsystem may further include: a second remote memory module defining a second remote memory space, the second remote memory module being coupled to the first remote memory module via a second extension interface, in which the first remote memory module further includes: a first remote memory controller configured to use a second address to map to a third address, wherein the third address is defined with respect to the second remote memory space and wherein the second address is determined with respect to the first remote memory space of the first remote memory module, and wherein the second address is converted from the first address by the DIMM memory controller.

The first remote memory controller may be further configured to provide a memory map, the memory map aggregating the second remote memory space with the first remote memory space.

According to another aspect of the present disclosure, a memory module includes: a dynamic random-access memory (DRAM) having a DRAM memory space; a non-volatile memory (NVM) having a NVM memory space; and a memory controller configured to map a first memory space, the first memory space including the DRAM memory space and the NVM memory space, wherein the memory controller is further configured to determine a first address with respect to the first memory space.

The memory module above may further include: a first interface configured to couple the memory module to a DIMM interface of a computing device.

The memory module may further include: a second interface configured to couple the memory module to a second memory module, the second memory module having a second memory space.

The memory module may be configured such that the memory controller is further configured to map an aggregated first memory space, the aggregated first memory space including the first memory space and the second memory space.

Optionally, the memory module further includes an address conversion table storable in the DRAM, the address conversion table being configured to map an address between the aggregated first memory space and the second memory space.

The memory controller may be further configured to map an address between the aggregated first memory space and one of the first memory space and the second memory space.

The second memory space may include a memory space of a DRAM device. The second memory space may include a storage space of a solid-state storage device. The second memory space may include a storage space of a hard disk drive. The second interface may include a networking interface circuit configured to couple the memory module with another storage equipment.

According to another aspect, the present disclosure provides a memory subsystem that includes: a first memory module including: at least one memory device providing a first memory space; a first memory controller configured to provide a first memory map of the first memory space; and a first interface configured to couple the first memory module with the DIMM interface; and a second memory module coupled to the first memory module, the second memory module including: at least one second memory device providing a second memory space; and a second memory controller configured to provide a second memory map of the second memory space to the first memory controller, wherein the first memory controller is configured to provide an aggregated memory map, the aggregated memory map including the first memory map and the second memory map.

The memory subsystem above, wherein the first memory controller is further configured to use a first address of the aggregated memory to map to a second address, the second address being an address of one of the first memory map and the second memory map.

According to another aspect, a memory subsystem of a computing device includes: a dual inline memory module (DIMM) including: a memory interface configured to couple with a system memory controller of the computer device; and a DIMM memory controller configured to map a DIMM memory space accessible by the system memory controller through the memory interface; and a cascade of remote memory modules, each remote memory module providing a respective remote memory space, wherein the cascade of remote memory modules is coupled to the DIMM such that the DIMM memory space is at least an accumulative total of the respective remote memory spaces.

DETAILED DESCRIPTION

Figure 1:
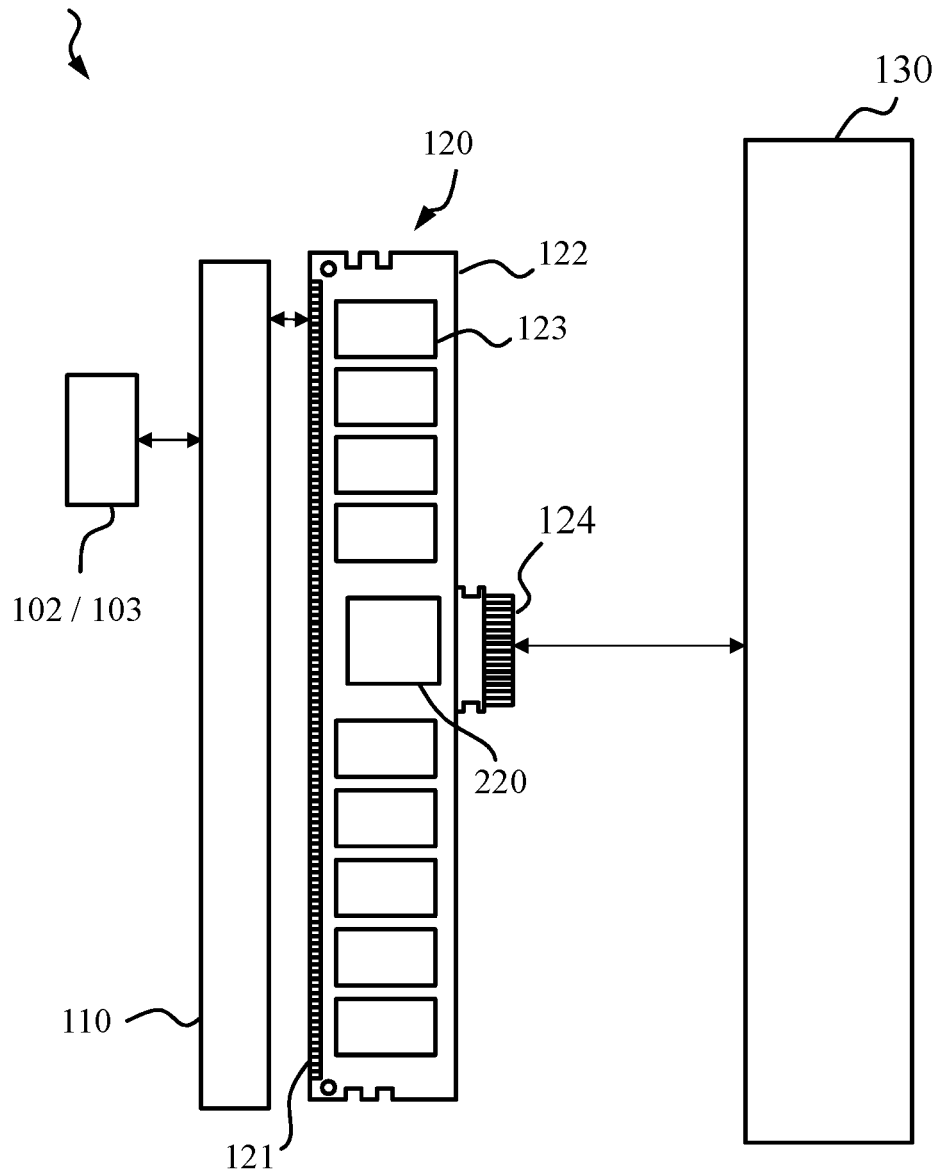
FIG. 1 shows an extensible memory subsystem according to one embodiment.

It will be readily understood that the components of the embodiments, as generally described and illustrated in the figures herein, may be arranged and designed in a wide variety of different configurations in addition to the described example embodiments. Thus, the following more detailed description of the example embodiments, as represented in conjunction with the figures, is not intended to limit the scope of the embodiments, as claimed, but is merely representative of example embodiments.

Reference throughout this specification to "one embodiment", "another embodiment" or "an embodiment" (or the like) means that a particular feature, structure, or characteristic described in connection with the embodiment is included in at least one embodiment. Thus, the appearance of the phrases "in one embodiment" or "in an embodiment" or the like in various places throughout this specification are not necessarily all referring to the same embodiment.

Furthermore, the described features, structures, or characteristics may be combined in any suitable manner in one or more embodiments. In the following description, numerous specific details are provided to give a thorough understanding of embodiments. One skilled in the relevant art will recognize, that the various embodiments be practiced without one or more of the specific details, or with other methods, components, materials, etc. In other instances, some or all known structures, materials, or operations may not be shown or described in detail to avoid obfuscation.

A computing device includes a central processing unit (CPU) on a mainboard of the computing device. The CPU is configured with an operating system for executing instructions and/or manipulating data. The CPU may be coupled to a solid-state drive and/or a hard disk drive via a Peripheral Component Interconnect express (PCIe) bus or another suitable bus. The computing device can be viewed as one computing node. To communicate with another computing node in a network, the computing device is configured to transfer data through a network protocol. Examples of network protocols include the TCP/IP network protocol and the remote direct memory access (RDMA) network protocol.

The CPU may be further configured to serve as a system memory controller. Alternatively, the computing device may separately provide a system memory controller configured to manage a memory subsystem. The memory subsystem defines and manages one or more memory spaces available for use by the CPU. The memory subsystem enables the temporary storage of data (including instructions) in a memory space, so that the CPU may execute instructions and/or manipulate data.

The memory subsystem may include one memory dual inline memory module (memory DIMM) or a plurality of memory dual inline memory modules. Each memory DIMM includes a plurality of dynamic random-access memories (DRAMs) disposed on a printed circuit board. Along one edge of the printed circuit board are multiple sets of contacts. Each set of contacts leads to a respective DRAM of the memory DIMM. The edge of the printed circuit board is receivable by a memory DIMM socket/slot on the mainboard. The memory DIMM socket/slot is coupled to the system memory controller. In this manner, the system memory controller can directly access the respective DRAM. It can be appreciated that the number of DRAMs on a memory DIMM is limited by the number of contacts that can be accommodated along the edge of the printed circuit board and the length of the corresponding memory DIMM socket/slot. Owing to physical limitations, the computing device provides a limited number of memory DIMM socket/slots. Each memory DIMM socket/slot is configured to receive one memory DIMM, therefore in a conventional memory subsystem, the maximum memory space available to the CPU is limited by physical constraints.

To overcome difficulties in the state of the art, the present invention provides an extensible memory subsystem suitable for use with a computing device. According to embodiments of the present disclosure, as shown in FIG. 1, a computing device 100 may include a system memory controller 102, in which the system memory controller is configured to manage an extensible memory subsystem 101. The system memory controller may be in the form of an integrated circuit (IC) chip as a separate device from a CPU 103, or the system memory controller may form part of the CPU chip. The CPU may include one or more processor cores, processor caches, buses or interconnections, logic, memory controllers, and/or other components. The extensible memory subsystem is configured to store data (including instructions) for use by the CPU. For example, the system memory controller may cache data in a memory space for faster access. In some embodiments, the memory space is provided by at least one extensible memory dual in-line memory module 120 (extensible memory DIMM) plugged or pluggable into a memory DIMM connector 110. One example of a memory DIMM connector is one configured for double data rate (DDR) socket/slot. A standard memory DIMM socket/slot, such as one that is JEDEC (Joint Electron Devices Engineering Council) standard-compliant, may be used with modification with embodiments of the present disclosure. In some embodiments, the extensible memory DIMM includes a first interface 121 suitable for coupling the extensible memory DIMM with the memory DIMM connector. It will be understood that a standard memory DIMM connector provided in a computing device may receive an extensible memory DIMM according to embodiments of the present disclosure, or it may receive a conventional memory DIMM. It will also be understood that with changing or new standards, an extensible memory DIMM of the present disclosure can be operably coupled with a memory DIMM connector of a changed or new standard so as to function as a part of a memory subsystem, without going beyond the claimed scope of the present disclosure. This advantageously paves a way for a conventional computing device to be upgraded with an extensible memory subsystem without replacing the existing system memory controller or the existing memory DIMM connectors. It will be understood that the extensible memory DIMM according to embodiments of the present disclosure may also be configured for operable coupling with other standard or non-standard connectors for the purpose of communicating with the system memory controller.

The extensible memory DIMM 120 includes dynamic random-access memories (DRAMs) 123 mounted to a printed circuit board 122. The DRAMs of the extensible memory DIMM collectively provides a basic memory space. When the extensible memory DIMM is coupled to a system memory controller 102, the extensible memory DIMM provides the basic memory space to the system memory controller, in which the basic memory space appears as one of extensible capacity. The extensible memory DIMM includes a second interface 124 configured to couple with a remote memory module 130. The remote memory module is configured to provide a first remote memory space. The extensible memory DIMM and the remote memory module are configured such that, to the system memory controller, the memory space accessible through the DIMM connector/first interface 110,121 is a cumulative total memory space inclusive of the basic memory space and the first remote memory space.

Alternatively described, the extensible memory DIMM can be configured to provide the system memory controller with a total extensible memory DIMM space, in which the total memory space accessible by the system memory controller can be changed without increasing the number of memory DIMM sockets/slots in the computing device. The system memory controller may send data (including instructions) via a memory bus through a memory DIMM interface to the extensible memory DIMM. The memory bus may follow a standard (such as the DDR4) or another predetermined protocol. In other words, the system memory controller and the memory DIMM connector coupled thereto need not be specially adapted before they can be used with an extensible memory DIMM of the present disclosure.

Figure 2:
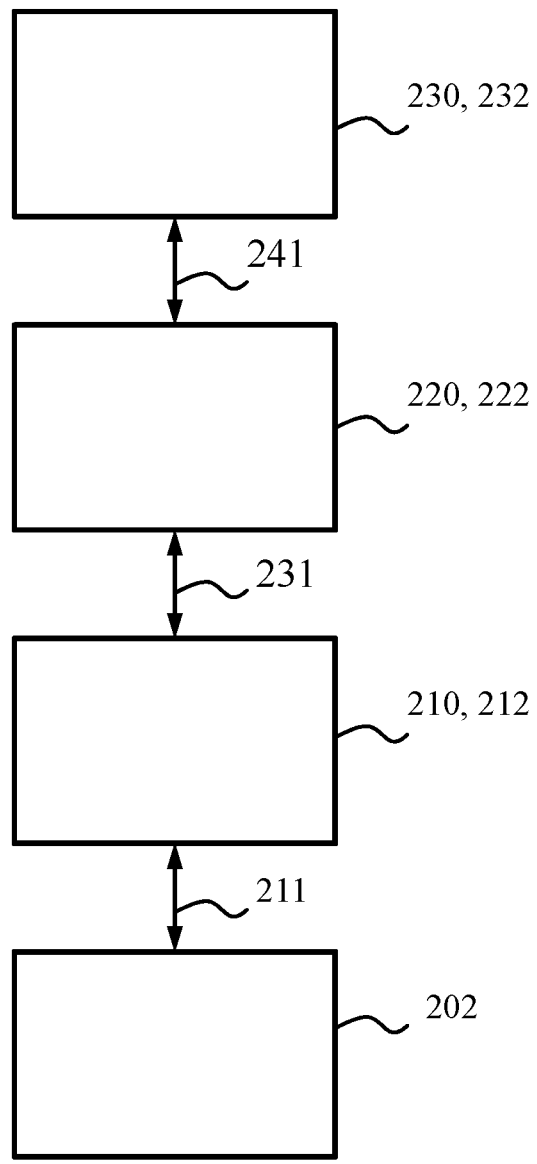
FIG. 2 schematically illustrates an extensible memory subsystem according to another embodiment.

To aid understanding, reference will be made to FIG. 2, and, at the same time, to FIG. 3A to FIG. 3C. Another embodiment of an extensible memory subsystem 200 may include a plurality of memory spaces 212,222,232 respectively provided or defined by an extensible memory DIMM 210 and remote memory modules 220,230 intercoupled in a cascade 201 as shown. For the sake of having a convenient reference, the "downstream" end of the cascade refers to the end where the extensible memory DIMM 210 is disposed. Alternatively described, the cascade leads downstream to the system memory controller 202.

Figures 3A, 3B, 3C:
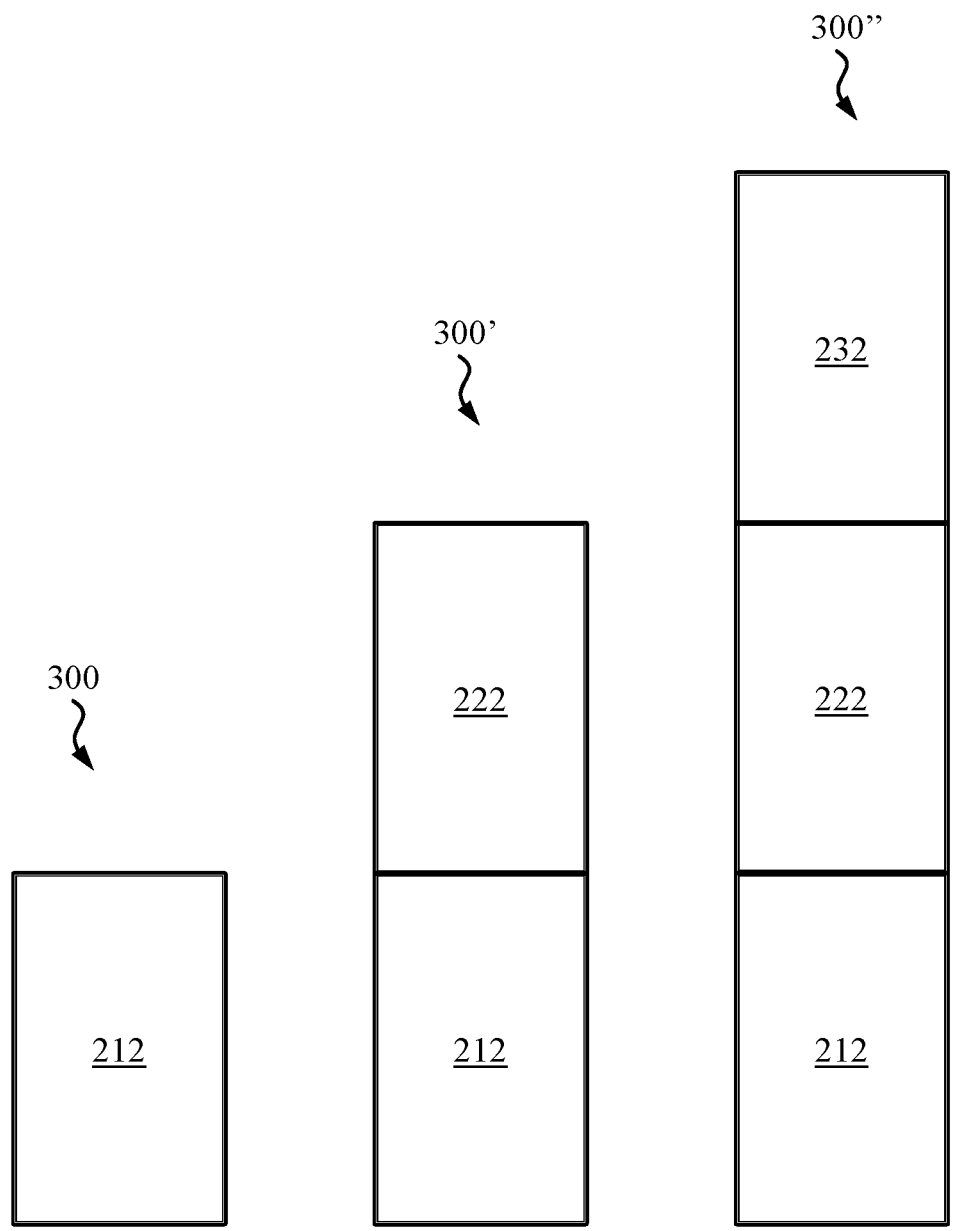
FIG. 3A, FIG. 3B, and FIG. 3C schematically illustrate the cumulative memory spaces of the memory subsystem of FIG. 2.

In some embodiments, for instance, the extensible memory DIMM is not coupled with another memory module through the second interface (FIG. 3A). The total extensible memory DIMM space 301 as perceived by the system memory controller 202 is the same as the basic memory space 212 contributed by the extensible memory DIMM 210.

In some embodiments, as in the example of FIG. 3B, the extensible memory DIMM 210 further includes a second interface/a first extension interface 231. The extensible memory DIMM 210 may be coupled with a first remote memory module 220 via the first extension interface 231. The extensible memory DIMM and the first remote memory module may communicate through the first extension interface in accordance with an extension memory bus. The first extension interface 231 can be considered an example of an upstream interface (relative to the extensible memory DIMM 210), and the extensible memory DIMM communicates upstream with the first remote memory module 220. In this example as shown in FIG. 3B, there is only one remote memory module 220 and one extensible memory DIMM 210 coupled to the system memory controller 202. The first remote memory module is configured to provide a first remote memory space contribution 222. The total extensible memory DIMM space 300' presented by the extensible memory DIMM to the system memory controller, or as perceived by the system memory controller at the memory DIMM interface 211, is a cumulative total or an aggregate of the basic memory space contribution 212 and the first remote memory space contribution 222.

In some embodiments, as schematically illustrated in FIG. 3C, the extensible memory DIMM 210 is coupled via the first extension interface 231 with the first remote memory module 220 for communication in accordance with an extension memory bus, and the first remote memory module 220 is further coupled via a second extension interface 241 (in accordance with the extension memory bus) with a second remote memory module 230. The second memory module provides a second remote memory space contribution 232. In such cases, the total extensible memory DIMM space 300" is a cumulative total or an aggregate of the basic memory space contribution 212, the first remote memory space contribution 222, and the second remote memory space contribution 232.

In some embodiments, the extensible memory DIMM is coupled via the first extension interface (in accordance with an extension memory bus) with the first remote memory module; the first remote memory module is further coupled via the second extension interface (in accordance with the extension memory bus) with the second remote memory module; and the second remote memory module is further coupled via a third extension interface (in accordance with the memory bus) with a third remote memory module. The third memory module provides a third remote memory space. In these examples, the total extensible memory DIMM space is an aggregate of the basic memory space, the first remote memory space, the second remote memory space, and the third remote memory module. The extensible memory DIMM may thus be configured to couple with n remote memory modules, and the total extensible memory DIMM space may be an aggregate of the basic memory space and all of these n remote memory spaces.

In some embodiments, an nth remote memory module may be coupled via an nth extension interface to an (n−1)th remote memory module (downstream). The nth remote memory module is configured to pass data downstream to the (n−1)th remote memory module, and eventually to the extensible memory DIMM and to the system memory controller. The nth remote memory module may also be coupled via an (n+1)th extension interface to an (n+1)th remote memory module (upstream), ad infinitum. With reference to the nth remote memory module, the upstream memory capacity would appear as a sum of all the memory capacities (that is, the maximum memory size) of all the upstream remote memory modules.

According to embodiments of the present disclosure, each memory module (including the extensible memory DIMM as well as any remote memory module in a cascade of memory module) will perceive the upstream memory space (if any) as one memory space, even if the upstream memory space is an aggregate of multiple upstream memory spaces. Each memory module is configured to present to the next memory module downstream a memory space that includes the memory space perceived upstream and its own memory space. Whether a memory space presented downstream is the same or larger than the memory space contributed by a memory module depends on whether the memory module is coupled to at least one memory module upstream. Thus, in this document, the terms "memory space" and "memory space contribution" are used interchangeably to refer to the memory space perceived/provided downstream since, since the downstream memory controller would not be aware of the configuration upstream.

Figure 4:
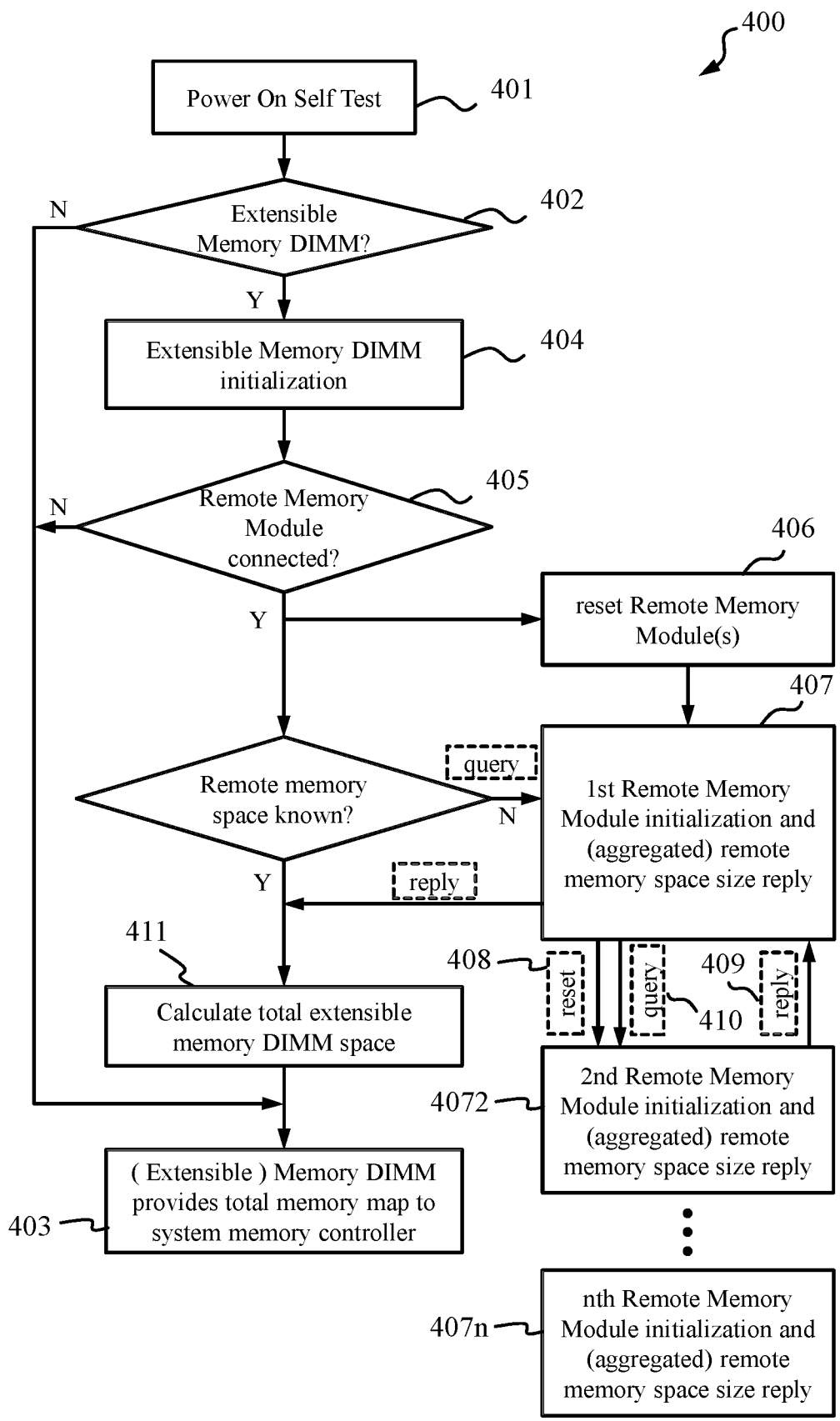
FIG. 4 illustrates a method of configuring an extensible memory subsystem according to one embodiment.

One exemplary method of configuring a system with an extensible memory DIMM will now be described with reference to FIG. 4. The extensible memory DIMM may include an DIMM memory controller. In this method 400, upon the system being powered up, a Power-On Self-Test (POST) initialization occurs 401. The computing device can be configured to perform the following as a part of POST. The computing device may be configured to first ascertain whether the device coupled to the memory bus is an extensible memory DIMM 402. If the device coupled to the memory bus is not an extensible memory DIMM, the total memory space available to the system memory controller via the memory DIMM interface is equivalent to that provided by the memory space of the non-extensible memory DIMM. The memory DIMM will provide a total memory map to the system memory controller, in which the total memory map will include only the memory space available physically on the memory DIMM 403.

If the system memory controller is coupled to an extensible memory DIMM via the memory DIMM interface, the extensible memory DIMM upon initialization 404 will ascertain whether at least a first remote memory module is coupled to the first extension interface 405. If the DIMM memory controller ascertains that the extensible memory DIMM is not coupled to at least a first remote memory module, the DIMM memory controller will provide to the system memory controller a total extensible memory DIMM space (map) that is equivalent to the basic memory space (map) 403.

Thus, it can be appreciated that the system memory controller need not be configured to make a distinction between a non-extensible memory DIMM and an extensible memory DIMM. Therefore, to avoid confusion, in this document, the term "total memory DIMM space" is used interchangeably with the term "total extensible memory DIMM space" in reference to the total memory space provided to the system memory controller via the memory DIMM interface.

The DIMM memory controller may be configured to ascertain whether the extensible memory DIMM is coupled to at least one remote memory module. If the extensible memory DIMM is coupled to at least one remote memory module (first remote memory module) via the first extension interface, the DIMM memory controller provides a reset signal to reset the first remote memory module 406. This or an equivalent trigger results in the first remote memory module to undergo initialization. The reset signal will also cause a second remote memory module to undergo initialization, in cases where there is a second remote memory module coupled to the first remote memory module.

The first remote memory module includes a first remote memory controller, in which the first remote memory controller is configured to ascertain whether another remote memory module (second remote memory module) is coupled to the first remote memory module. That is, the first remote memory controller is configured to ascertain whether another remote memory module is coupled to the first extension interface.

The first remote memory controller is configured such that, if the first remote memory module is not coupled with a second remote memory module, the first remote memory controller will reply 407 the DIMM memory controller with a memory map that includes only memory locations on the first remote memory module. The memory space provided by the first remote memory module is referred to as a first remote memory space.

The first remote memory controller is configured such that, if the first remote memory module is coupled with a second remote memory module, the first remote memory controller will query 410 a second remote memory controller of the second remote memory module. In response, the second remote memory controller provides a reply 409 to the first remote memory controller, in which the reply informs the first remote memory controller of the second remote memory space 4072. The first remote memory controller is configured to aggregate the second remote memory space with the first remote memory space. This aggregated memory space is stored in the first remote memory controller. The first remote memory controller may be configured such that it stores the aggregated memory space until a reset signal (or a refresh command) is received 408. Thus, the first remote memory module is configured such that, when the first remote memory module is coupled with a second remote memory module, the first remote memory controller will provide the DIMM memory controller with a memory space (map) formed from an aggregate of the first remote memory space and the second remote memory space.

It will be understood that, when the second remote memory module is coupled to the first remote memory module and not coupled to any other remote memory module, the memory space presented by the second remote memory controller to the first remote memory controller is just the second remote memory space. In cases where the second remote memory module is coupled to the first remote memory module "downstream" (that is, through the first extension interface) and also coupled to a third remote memory module "upstream" (that is, through the second extension interface), the memory space presented by the second remote memory controller to the first remote memory controller is an aggregate of the second remote memory space and the third remote memory space. In cases where one or more additional remote memory modules are coupled upstream of the second remote memory module, the memory space presented by the second remote memory controller to the first remote memory controller is an aggregate of the respective memory spaces upstream of the first remote memory space (including the second remote memory space). The terms "upstream" and "downstream" are used in a relative sense. Thus, where a first remote memory module is coupled with a second remote memory module via an interface, the interface may be upstream relative to the first remote memory module and the same interface is downstream relative to the second remote memory module.

If there are n remote memory modules coupled to the system under initialization, the initialization of the remote memory modules may begin from the nth remote memory module, that is the remote memory module logically furthest or distal relative to the extensible memory DIMM. The cascade of memory modules may be configured so that the reset signal is passed upstream to the nth remote memory module 408. The sizes of the remote memory spaces are then aggregated or cascaded down from the nth remote memory module to the first remote memory module in reply 409 to queries 410 directed upstream 407*n*. The first remote memory module (or the remote memory module that is logically directly coupled with the extensible memory DIMM) is thus able to provide the extensible memory DIMM with a memory map of the remote memory space 411.

According to some embodiments, the DIMM memory controller is configured to determine or define the total memory space after querying the first remote memory controller 405'. According to some embodiments, the DIMM memory controller can determine or define a total memory space without querying the first remote memory controller. In both cases, the DIMM memory controller may be configured to calculate a total memory space, and to provide the total memory space to the system memory controller. Alternatively, or additionally, in some embodiments, the DIMM memory controller may be programmable by a user so that the DIMM memory controller reflects the total memory space available through the memory DIMM interface. Alternatively, or additionally, in some embodiments, the system memory controller may be programmable by a user so that the total memory space available to the system memory controller is known.

After initialization, the system memory controller perceives the memory space at the memory bus as one total memory space. The system memory controller may perceive the memory space at the memory bus as one total memory space, although the one total memory space is actually an aggregate of the extensible memory DIMM space (the basic memory space), the first remote memory, and the second remote memory, etc. Regardless of the exact number of physical devices coupled directly and/or indirectly to the extensible memory DIMM, the system memory controller perceives the memory space available from one extensible memory DIMM as one memory space. The system memory controller may remain unaware of the number and type of memory or memories coupled to the extensible memory DIMM.

Figure 5A:
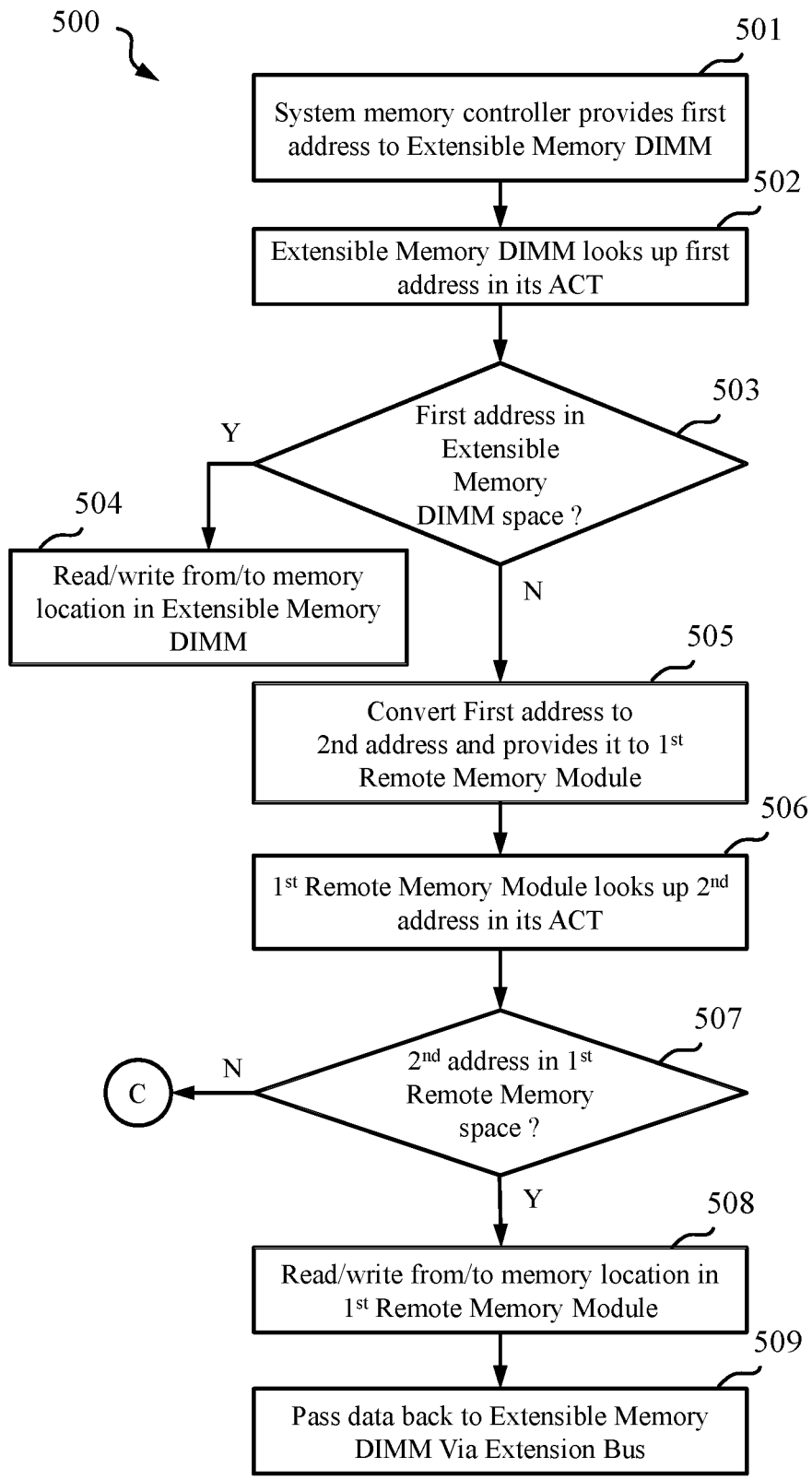
FIG. 5A and FIG. 5B illustrate a method of operating with an extensible memory subsystem, in accordance with one embodiment.
Figure 5B:
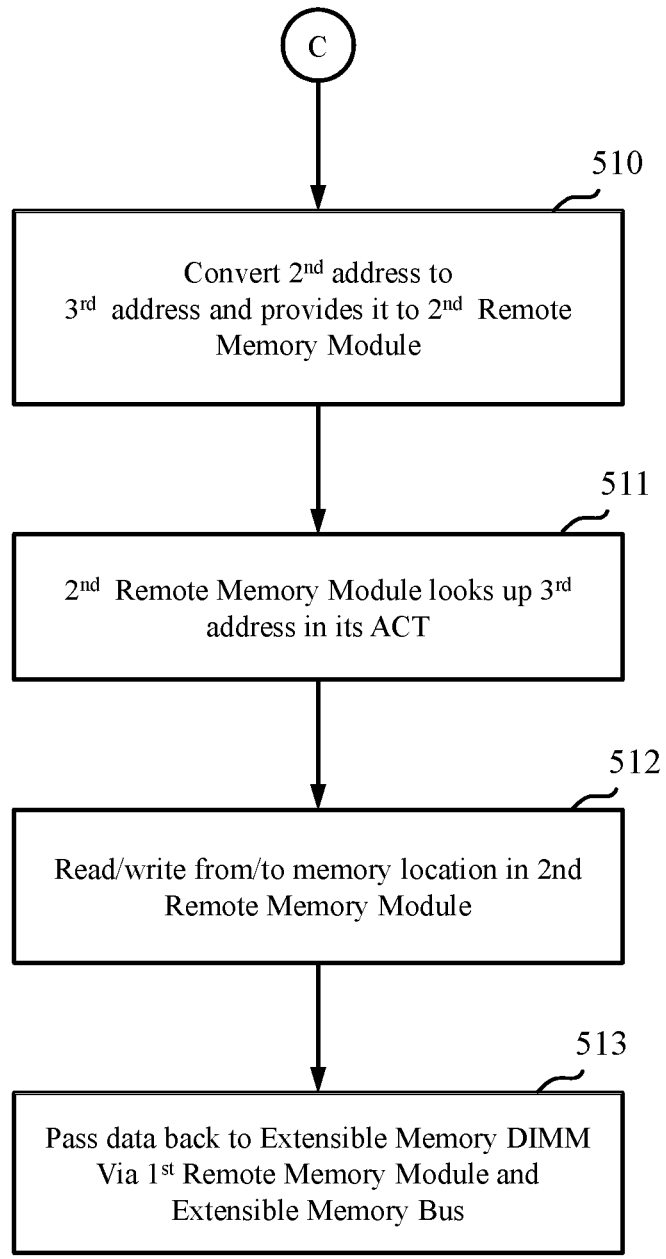

One exemplary method 500 of operating with an extensible memory DIMM will be described with reference to FIG. 5A and FIG. 5B. Reference may also be made to FIG. 6 to FIG. 9 which schematically illustrates examples of different configurations that can be implemented using the method. In a memory subsystem, a system memory controller provides a first address 601 to an extensible memory DIMM (such as one described above) 501. The first address may be provided with respect to data (including instructions) to be retrieved or saved from/to a memory location. The first address is determined as an address in a total memory space perceived by the system memory controller. In this document, this may interchangeably be expressed in other words, e.g., in terms of the first address being determined with respect to a total memory space perceived by the system memory controller. The system memory controller need not be aware of whether the first address points to a memory location in a basic memory space 630 (of the memory DIMM) or in a remote memory space 640. The system memory controller need not be aware of whether the total memory space is solely provided by the basic memory space 630 or an aggregated memory space 610. The aggregated memory space (if there is one) may include a remote memory space 640 and the basic memory space 630, and/or the remote memory space is itself an aggregated memory space. Alternatively described, the system memory controller need not make a distinction between a memory location that is physically on the extensible memory DIMM and a memory location that is physically on a remote memory module or elsewhere.

Figure 6:
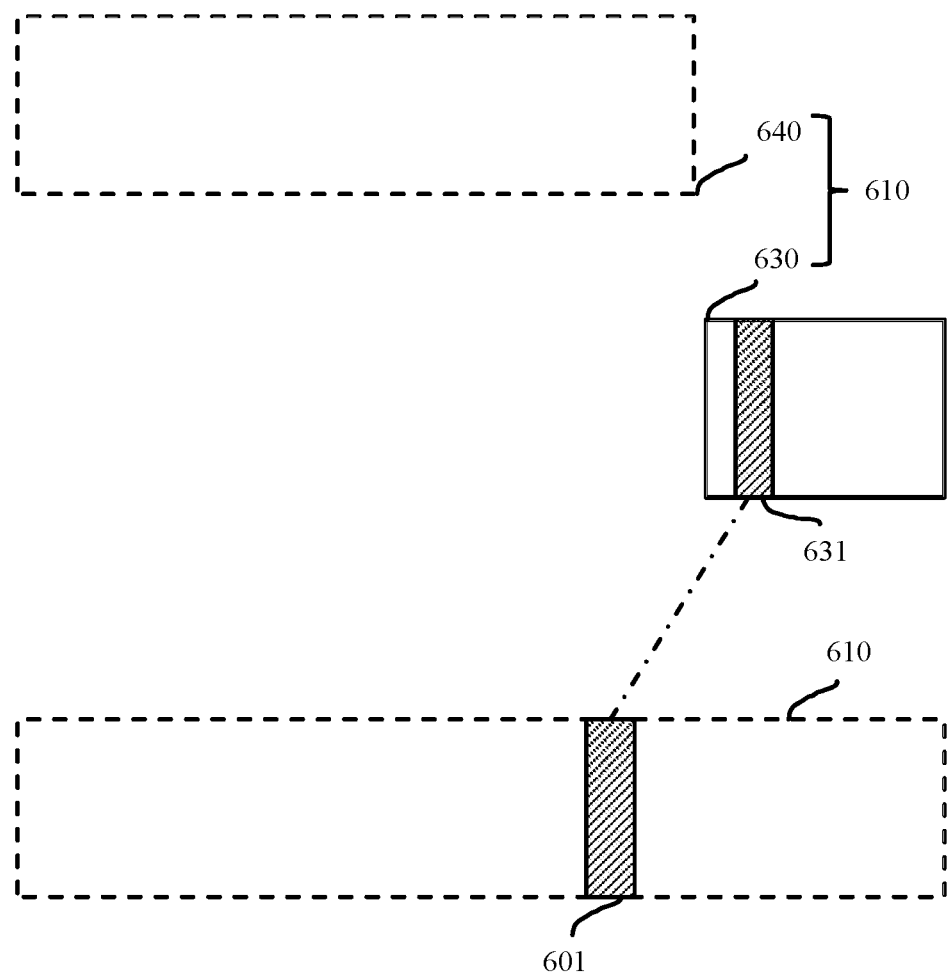
FIG. 6 schematically illustrates address mapping by an DIMM memory controller, according to one embodiment.

The extensible memory DIMM includes an DIMM memory controller which, upon receiving the first address (which is determined with respect to the total memory space, or which is determined as an address in the total memory space), uses the first address to determine whether or not the first address falls within the basic memory space of the extensible memory DIMM 502,503. For example, as shown in FIG. 6, the first address may be one corresponding to a memory location 631 in one of the DRAMs on the extensible memory DIMM. If the first address is found in the basic memory space, the DIMM memory controller can proceed to read/write from/to the memory location in the basic memory space 504, in which the memory location is one corresponding to the first address.

The DIMM memory controller may perform the determination (of whether the first address corresponds to an address in the basic memory space) by performing a look-up or otherwise converting the first address. One example of performing the determination to use an address conversion table (ACT) or a memory map in which each first address in the total memory space can be mapped to either an address in the basic memory space, or a second address in a remote (aggregated) memory space.

The extensible memory DIMM ACT may be configured in the DIMM memory controller itself. Alternatively, the extensible memory DIMM ACT may be provided in a separate memory device that is disposed on the extensible memory DIMM. The extensible memory DIMM ACT may be stored in a DRAM or a non-volatile memory (NVM).

Figure 7:
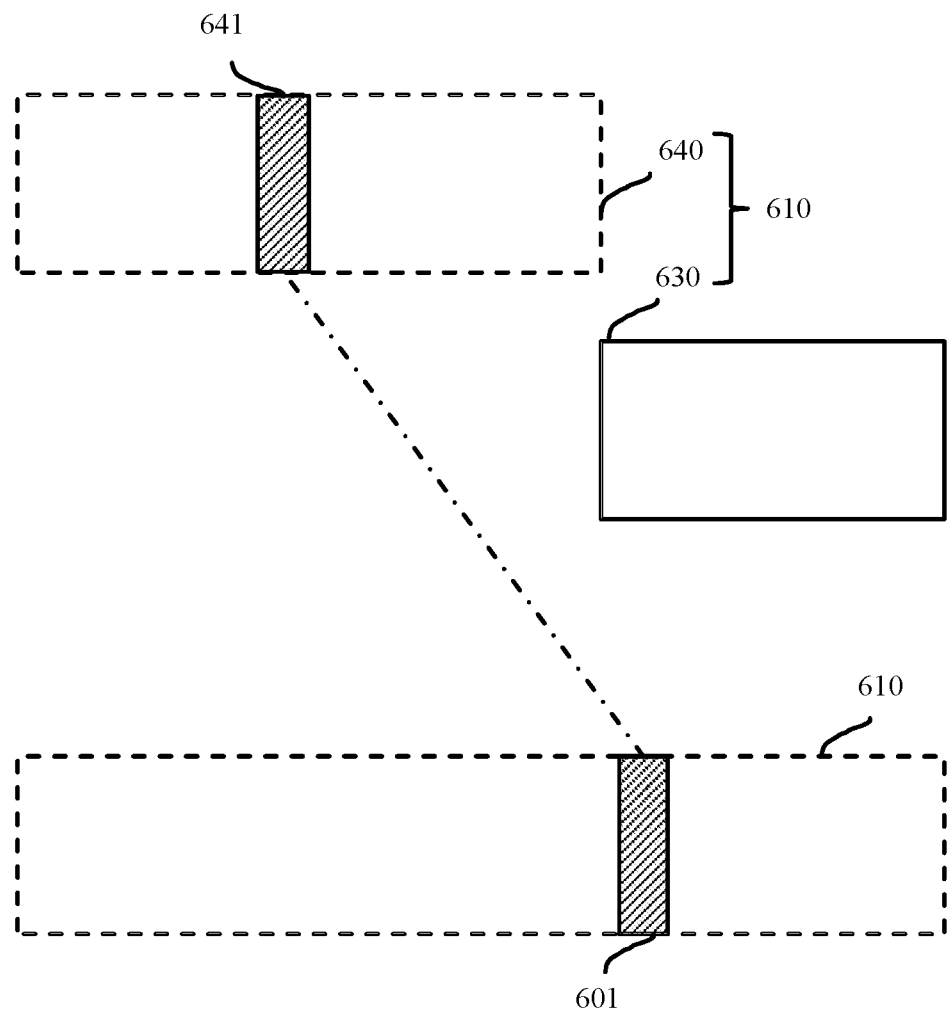
FIG. 7 schematically illustrates address mapping to a first remote memory space, in accordance with another embodiment.

In some examples, as shown in FIG. 7, the extensible memory DIMM ACT may be configured to map or otherwise convert 505 the first address 601 to a second address 641, and the second address is not found in the basic memory space but in a remote (aggregated) memory space 640 upstream of the basic memory space 630. The extensible memory DIMM ACT of the extensible memory DIMM may be configured so that, if the second address is not found in the basic memory space, the DIMM memory controller is only aware that the second address 641 is found in a remote (aggregated) memory space 640, without making a distinction of which remote memory space (if there is more than one remote memory space available). If the DIMM memory controller determines that the second address falls within the remote memory space, the DIMM memory controller then provides the second address to the first remote memory controller 505.

Figure 8:
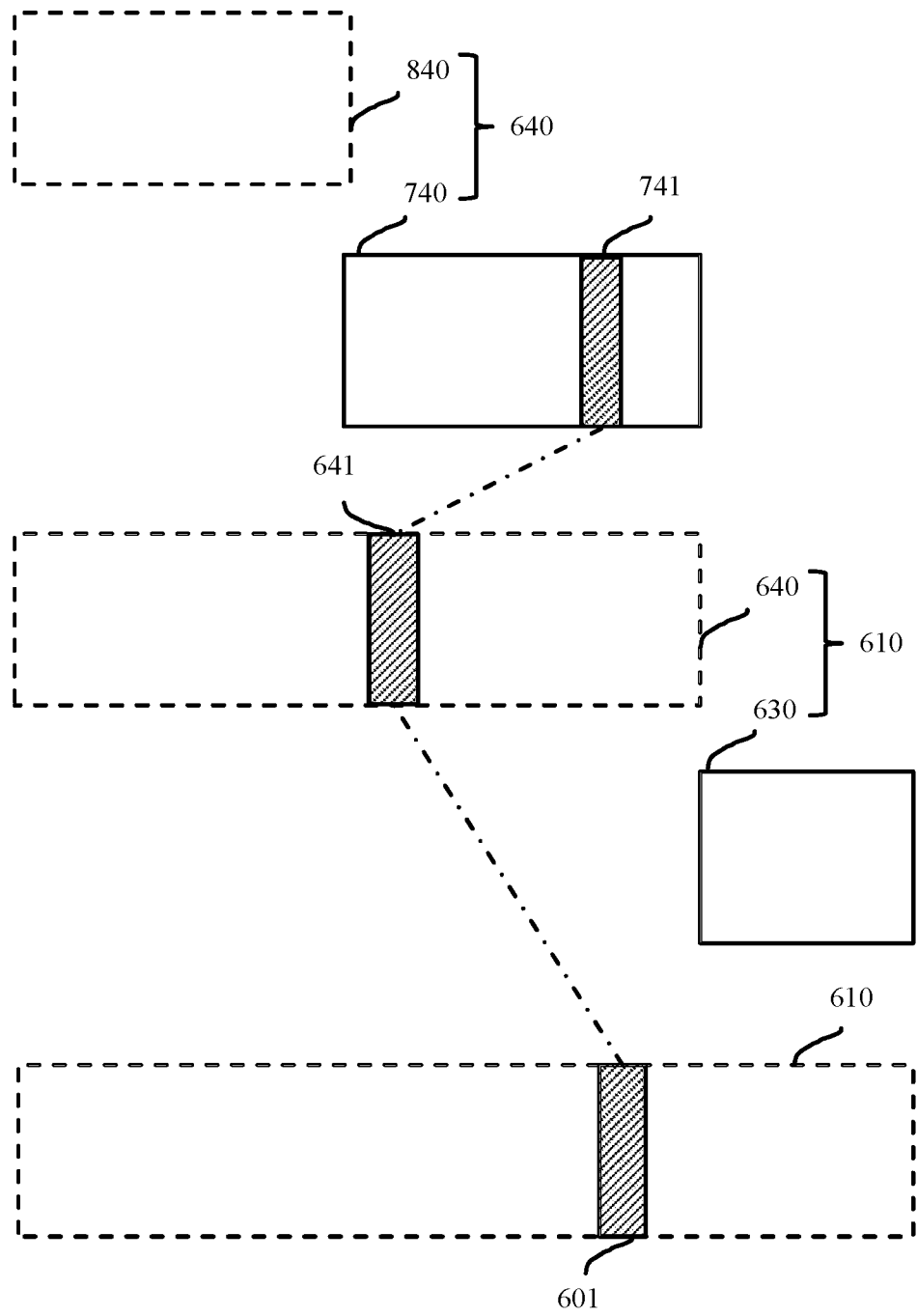
FIG. 8 schematically illustrates address mapping to a second remote memory space, according to another embodiment.

If the first remote memory module is not coupled to at least one other remote memory module upstream of itself, the second address 641 received by the first remote memory controller should correspond to a memory location 741 in the first remote memory space 740 (FIG. 8).

If the first remote memory module is coupled with at least one remote memory module upstream from itself, the first remote memory controller uses the second address to determine if the second address is found in the first remote memory space 740, or if the second address is found in a remote (aggregated) memory space 840 upstream of the first remote memory space. The first remote memory controller may be configured to perform such a determination by performing a look-up or otherwise converting the second address 506. One example of performing the determination may involve using a first remote address conversion table (ACT) in which each second address received by the first remote memory controller can be mapped to an address in the first remote memory space, or to a third address in a remote (aggregated) memory space upstream of the first remote memory space.

The first remote ACT may be configured in the first remote memory DIMM controller itself. Alternatively, the first remote ACT may be provided in a separate memory device that is disposed on the first remote memory module. The first remote ACT may be stored in a DRAM or a non-volatile memory (NVM).

If the first remote memory controller determines that the second address falls within the first remote memory space 507, the first remote memory controller enables a read/write operation from/to a corresponding memory location in the first remote memory space 508 (FIG. 8). If data is retrieved from the corresponding memory location in the first remote memory space, the data is passed back to the extensible memory DIMM via the first extension interface 509. The system memory controller will receive the data from the extensible memory DIMM through the memory bus, as though the data had been stored in a memory location on the extensible memory DIMM itself. Thus, the system memory controller will perceive the total memory space of the extensible memory DIMM as a larger memory space (aggregate of the basic memory space and the first remote memory space) than what is physically available on the extensible memory DIMM alone.

If the first remote memory controller determines that the second address falls in a remote (aggregated) memory space upstream of the first remote memory space, the first remote memory controller may convert the second address to a third address 510. The third address is defined with respect to a remote (aggregated) memory space 840 that is upstream from the first remote memory space 740, and the second address is determined with respect to a larger memory space, in which the larger memory space includes the first remote memory space and the remote (aggregated) memory space upstream from the first remote memory space. The first remote memory controller may be configured to provide the third address to the second remote memory controller, in which the second remote memory controller is upstream from the first remote memory controller 510. The second remote memory controller may be disposed on a second remote memory module coupled upstream from the first remote memory module. The second remote memory module is coupled to the first remote memory module by the second extension interface. That is, the first remote memory controller and the second remote memory controller are coupled to communicate with each other via the second extension interface.

In an example where the second remote memory module is not coupled to another remote memory module upstream from itself, the second remote memory controller may use the third address to look up a memory location in the second remote memory space 840, in which the second remote memory space is one physically provided on the second remote memory module 511.

In another example where the second remote memory module (having a second remote memory space) is coupled with at least one other remote memory module upstream of the second remote memory module, the second remote memory controller is configured to determine whether the third address corresponds to a memory location in the second remote memory space or to a memory location upstream of the second remote memory space.

If the second remote memory controller finds a corresponding memory location in the second remote memory space, the second remote memory controller reads/writes data from/to the corresponding memory location 512. If data is read from the corresponding memory location, the data is passed from the second remote memory module via the second extension interface to the first remote memory module, and then from the first remote memory module via the first extension interface to the extensible memory DIMM 513. The system memory controller may thus receive the data from the extensible memory DIMM as though the data had been stored in the extensible memory DIMM rather than in a remote memory module. It is transparent to the system memory controller whether the data is read from or written to a basic memory space or a remote memory space. It is transparent to the system memory controller whether the data is read from or written to a first remote memory space or a second remote memory space.

If the second remote memory controller determines that the third address (received from the first remote memory controller) does not correspond to a memory location on the second remote memory space 740, the second remote memory controller performs a look-up or otherwise converts the third address to a fourth address. The second remote memory controller may use a second remote address conversion table (second remote ACT) to convert the third address to the fourth address.

In this example, the third address is defined with respect to a memory space that includes the first aggregated memory space as well as an aggregate of all the remote memory spaces upstream from the first remote memory space; whereas the fourth address is defined with respect to a memory space that includes an aggregate of all the remote memory spaces upstream from the first remote memory space but excludes the first remote memory space.

Figure 9:
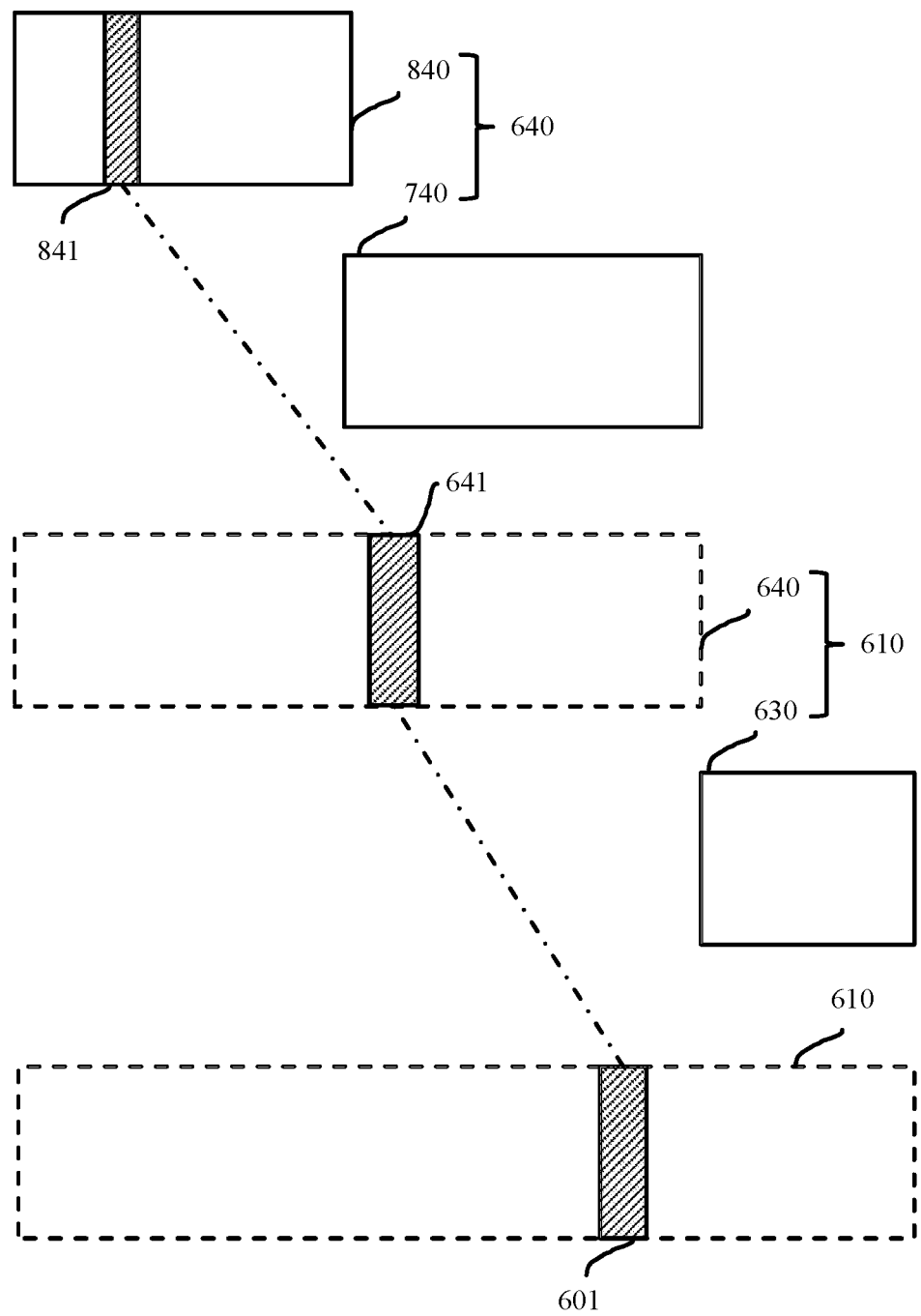
FIG. 9 schematically illustrates address mapping to a memory space upstream of the second remote memory space.

Upon the second remote memory controller determining that the third address corresponds to a memory location 841 in some remote memory module upstream of the second remote memory module, the second remote memory controller converts the third address to the fourth address, and passes the fourth address to a third remote memory controller, in which the third remote memory controller is part of a third remote memory module, and the third remote memory module is upstream from the second remote memory module (FIG. 9).

While the above describes a configuration involving up to three remote memory modules, it can be understood that more remote memory modules may be provided and configured in the manner described above. Generally speaking, a memory module includes a memory controller which is configured to convert a first address to a second address, in which the first address is defined with respect to a first memory space, the second address is defined with respect to a second memory space, the first memory space including the second memory space. The first address is provided through a downstream interface of the memory module. The second address is provided through an upstream interface of the memory module. The memory module is configured to provide a memory space, the memory module including the memory controller configured to receive a upstream memory map from a upstream memory module and to provide an downstream memory map to an downstream memory module, in which the upstream memory map corresponds to an aggregate of one or more upstream memory spaces, and in which the downstream memory map corresponds to an aggregate of the upstream memory map and the memory space. The memory space may itself be an aggregate of memory spaces and/or storage spaces. The memory controller is further configured to provide a downstream memory map that corresponds to the memory map, when there is no upstream memory module coupled to the memory module. The memory module is further configured to communicate with the upstream memory module through the upstream interface. The remote memory module is further configured to communicate with the downstream memory device through a downstream interface.

Alternatively described, the remote memory modules may be intercoupled in a series so that the respective memory spaces as defined by the respective remote memory controllers are cascaded downstream. In a series of intercoupled remote memory modules, the remote memory controller of a selected remote memory module will define a remote memory space that includes at least a cascaded or accumulative total of the remote memory spaces upstream of the selected remote memory module. The remote memory spaces are cascaded or accumulated in a downstream direction so that the remote memory space (as defined by the respective remote memory controller) increases with increasing proximity to the extensible memory DIMM module.

Figure 10:
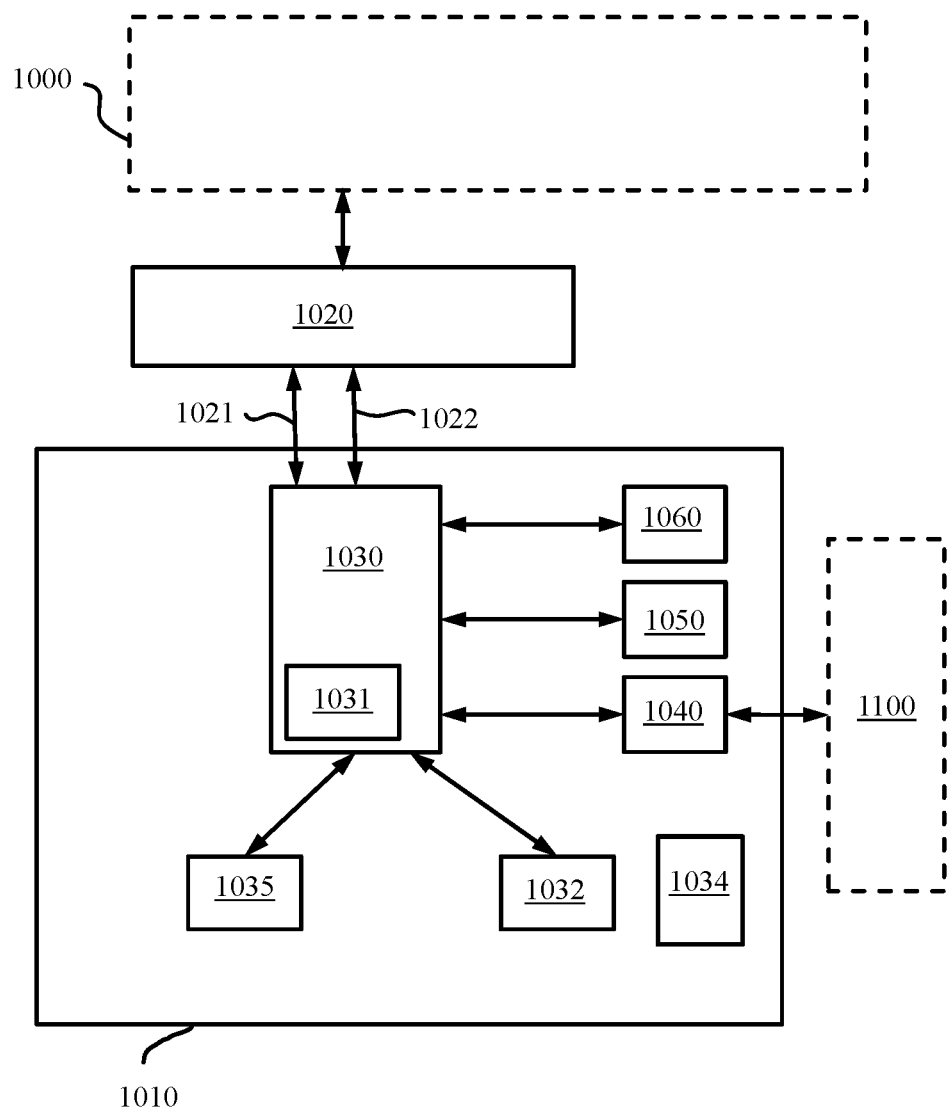
FIG. 10 shows an extensible memory DIMM according to one embodiment.

As an example, and as shown in FIG. 10, a computing device according to one embodiment of the present disclosure includes an extensible memory DIMM 1010 configured to be coupled to a host CPU 1000 via a memory DIMM interface 1020, such as a standard-compliant DIMM socket/slot. The extensible DIMM may include sets of contacts along a first edge of a printed circuit board, the first edge and the sets of contacts being configured for coupling to the memory DIMM socket/slot.

The extensible memory DIMM is provided with an extensible memory controller 1030 and buses 1021/1022. The host CPU and the extensible memory controller communicate by way of a DDR-T memory bus 1021 and a system management bus 1022. The extensible memory controller is configured to incorporate serial presence detect (SPD) functionality 1031. The extensible memory DIMM may include a firmware flash memory 1032 that communicates with the DIMM memory controller via a serial peripheral interface bus. The extensible memory DIMM may further include a battery 1034 (which may be in the form of a supercapacitor) and a power management integrated circuit (PMIC) 1035. The PMIC may be coupled with the DIMM memory controller to enable on-DIMM power management independent of the host CPU. The DIMM memory controller and the PMIC may be configured to communicate according to an inter-integrated circuit bus ($I^2C$ bus) protocol.

The extensible memory DIMM is configured with an extension memory interface 1040 that is suitable for coupling with a remote memory module 1100. The extension memory bus may be configured similarly as the memory DIMM bus between the extensible memory DIMM and the system memory controller. The extension memory bus is configured to communicate data including instructions), addresses, and SPD information.

The extensible memory DIMM includes at least one dynamic random-access memory (DRAM) 1050. The at least one DRAM physically embodies memory locations that collectively form a memory space provided by the extensible memory DIMM alone. That is, the memory devices disposed on the extensible memory DIMM collectively provide a basic memory space. The DIMM memory controller is configured to provide a memory map that includes the basic memory space. The DIMM memory controller may be configured to provide the host CPU with a memory map of a total memory space or an aggregated memory space, in which the memory map includes the basic memory space and a remote memory map received or retrieved through the extension memory interface. The extensible memory DIMM includes an address conversion table (ACT) 1060. The ACT may be stored in a designated DRAM, or it may be stored in a flash memory. The ACT may alternatively be stored in the DIMM memory controller.

Figure 11:
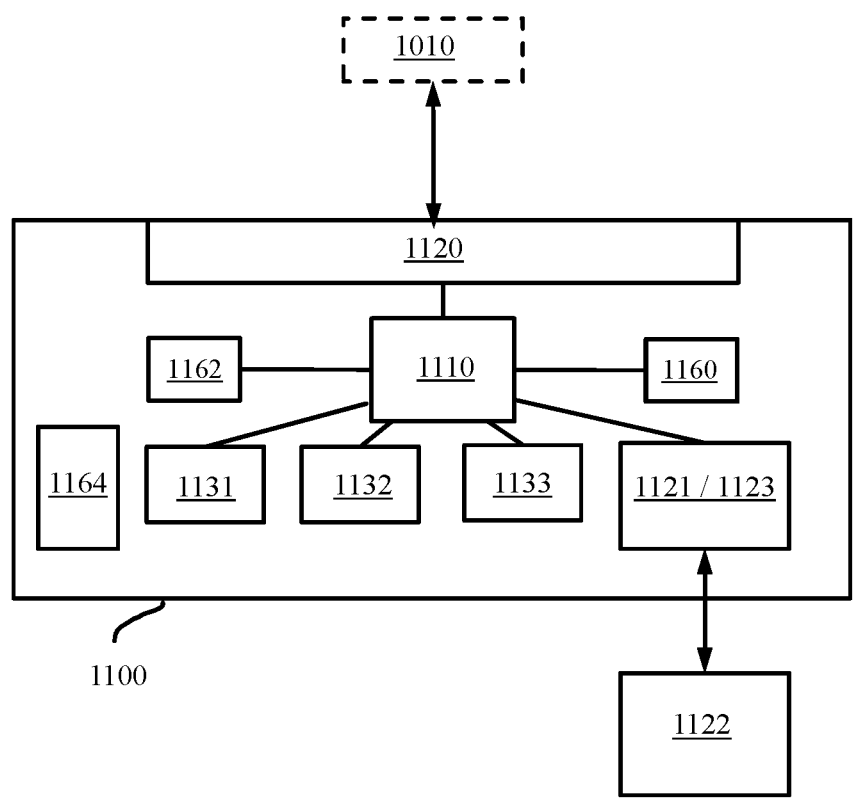
FIG. 11 shows a remote memory module according to one embodiment, for connecting with the extensible memory DIMM of FIG. 10.

As shown in FIG. 11, a remote memory module 1100 according to one embodiment of the present disclosure includes a remote memory controller 1110 disposed on the remote memory module. The emote memory module may include a remote address conversion table (remote ACT) 1160. The remote ACT may be part of the remote memory controller, or it may be a separate IC chip. The remote ACT may be copied to a flash memory or a non-volatile (persistent) memory 1162. The remote memory module may further be configured with a battery and power management circuitry 1164.

The remote memory module further includes a first extension interface 1120 suitable for operable coupling between the remote memory module and an extensible memory DIMM as described above. The remote memory module may further include a second extension interface 1121 suitable for coupling to another remote memory module 1122. The remote memory module 1100 may include a first extension interface configured to couple with a downstream memory module such as an extensible memory DIMM as described above, and a second extension interface configured to couple with an upstream memory module. The remote memory module 1100 may also be coupled with other remote memory modules such that the first extension interface is coupled to a downstream remote memory module, and the second extension interface is coupled to an upstream remote memory module.

The remote memory module 1100 may include one or more memory/storage devices. The one or more memory/storage devices may be selected from a group consisting of DRAMs 1131, flash memories 1132, and storage drives 1133 (solid-state and/or hard disk). The remote memory controller is configured to access the respective memory devices and/or storage devices, so that the remote memory controller can define a remote memory space that includes the memory spaces of the respective memory and/or storage devices disposed on or coupled to the remote memory module. The remote memory module may further be provided with a networking interface circuit 1123, through which a cloud storage and/or a network storage device may be accessible by the remote memory controller, such that the memory space of the cloud storage and/or network storage appears as part of the remote memory space. In other words, the remote memory controller is configured to define or provide a remote memory space. The remote memory space corresponds to memory locations in the memory and/or storage devices on/coupled to the remote memory module.

Figure 12:
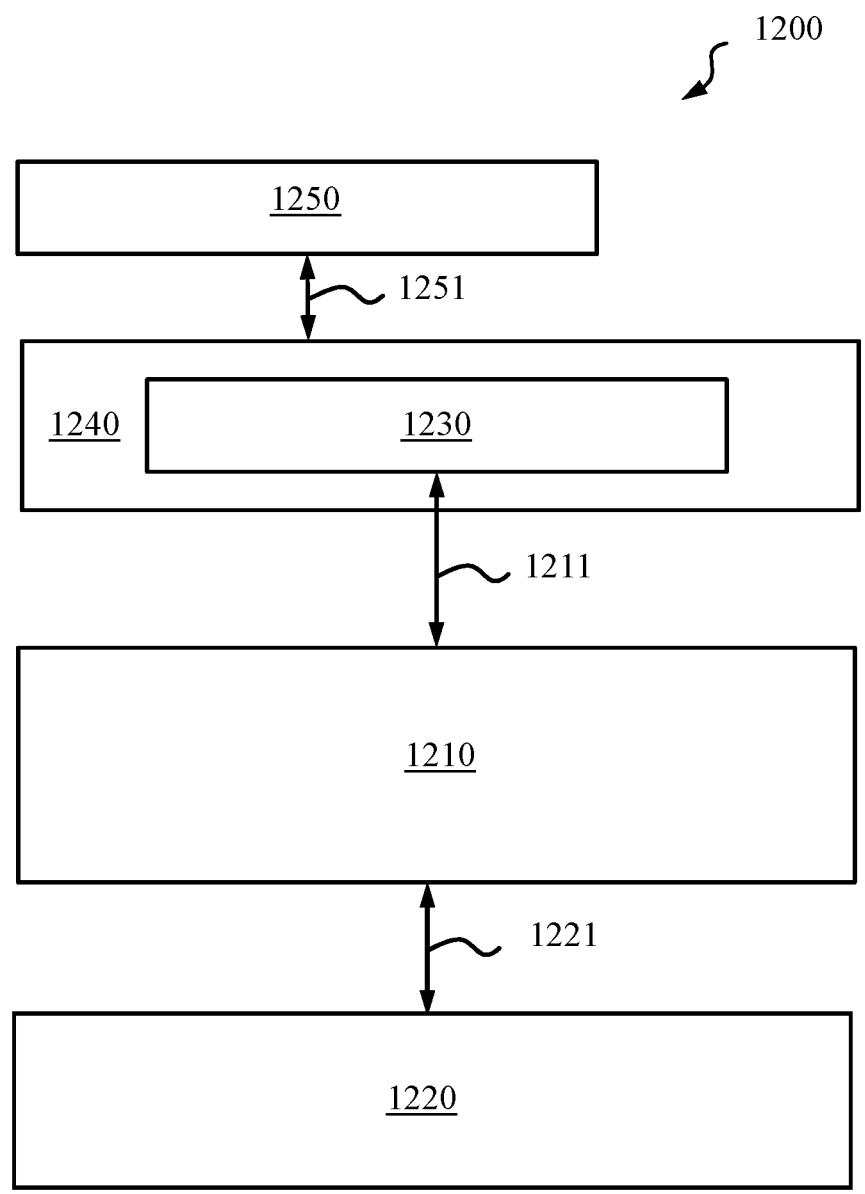
FIG. 12 shows an extensible memory subsystem that includes a plurality of memory DIMMs, at least one of which is the extensible memory DIMM of FIG. 10.

As shown in FIG. 12, a memory subsystem 1200 according to one embodiment of the present disclosure includes an extensible memory DIMM 1210 coupled with a remote memory module 1220 via an extension interface 1221. In this example, the remote memory module provides a remote memory space that is provided collectively by a plurality of DRAMs mounted to the remote memory module. The remote memory module may be provided with other types of memory devices and/or storage devices, including but not limited to another storage equipment accessible by the remote memory controller via cloud and/or other networks. The said storage equipment may include a memory device, a memory module, and/or any class of storage devices.

In one extensible memory subsystem, the system memory controller 1230 of a host/computing device 1240 may be coupled with at least one extensible memory DIMM 1210 via a first memory DIMM interface 1211, and at the same time, the system memory controller is coupled with at least one conventional memory DIMM 1250 via a second memory DIMM interface 1251. FIG. 12 further illustrates an extensible memory subsystem in which the system memory controller is coupled with a plurality of memory DIMMs, of which at least one of the plurality of memory DIMMs is an extensible memory DIMM. The system memory controller is provided with access to a total extensible memory space that can be varied in capacity (maximum usable memory and/or storage space) according to user requirements, the total extensible memory space being accessible through a selected one of the plurality of memory DIMMs. In particular, the total extensible memory space is configured to be accessible through the extensible memory DIMM.

Figure 13:
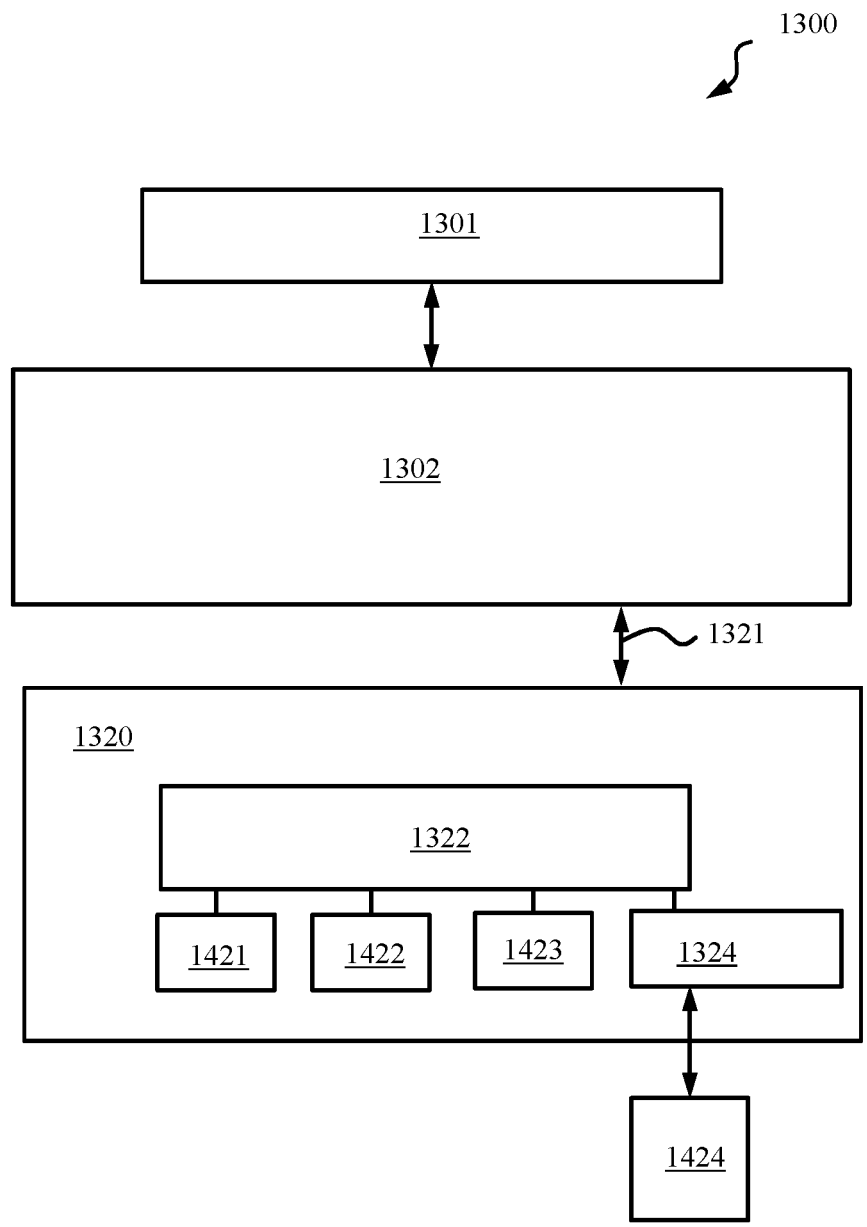
FIG. 13 shows the extensible memory DIMM of FIG. 10 coupled with the remote memory module of FIG. 11.
Figure 14:
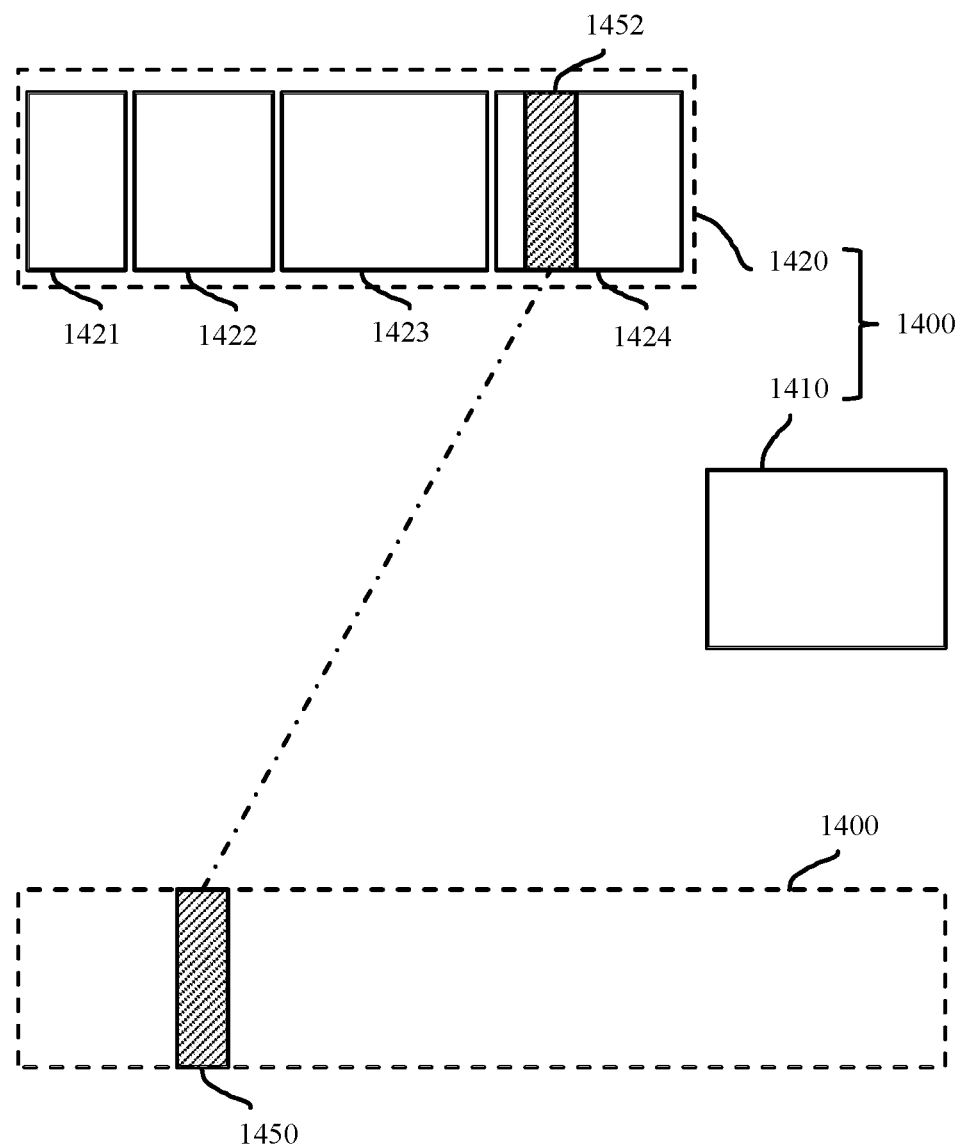
FIG. 14 schematically illustrates the memory spaces corresponding to an extensible memory subsystem of FIG. 13.

FIG. 13 and FIG. 14 illustrate an example of an extensible memory subsystem 1300 in which a system memory controller 1301 is coupled to an extensible memory DIMM 1302 via a memory DIMM interface 1303, and the extensible memory DIMM is coupled to a remote memory module 1320 via an extension interface 1321. The total memory space 1400 of the memory subsystem includes a basic memory space 1410 and a remote memory space 1420. In this example, the remote memory space 1420 is an aggregate of a plurality of DRAM memory spaces 1421, 1422, a solid-state drive (SSD) storage space 1423, and a network storage space 1424. The network storage space may be provided to the remote memory module via cable or wirelessly, as part of a local area network, a wide area network, a cloud storage, etc. The network storage space may be accessible by the remote memory controller 1322 via a networking interface circuit 1324. The remote memory module is configured to treat the storage/memory capacity of the physical network storage device as part of an aggregated memory space. In turn, the aggregated memory space may be further aggregated with the basic memory space by the extensible memory controller, so that the system memory controller perceives the network storage space as part of the memory DIMM space.

A second address 1452 pointing to a memory location on the network storage space may be allocated by the remote memory controller. The second address may be one defined with respect to the remote memory space 1420. When the second address is passed to the DIMM memory controller, the DIMM memory controller will map the second address to a first address 1450. The first address is defined with respect to a total memory space 1400, in which the total memory space is an aggregate of the remote memory space 1420 and a basic memory space 1410. The basic memory space is provided by memory devices (such as DRAMs) disposed on the extensible memory DIMM. The basic memory space may itself be an aggregated memory space. The address passed from the DIMM memory controller to the system memory controller is the first address, that is, an address defined with respect to the total memory space. The total memory space in this example includes the basic memory space and the remote memory space, in which the remote memory space itself is an aggregate of various memory and/or storage spaces, including and not limited to those provided by memory (and/or storage) devices disposed on the remote memory module. Each of the memory and/or storage spaces are accessible at the memory subsystem level via a memory bus without going through the CPU of the computing device. Thus, the system memory controller needs only a memory map to the total (aggregate) memory space in order to access/use memory space extensible beyond the immediate memory DIMM.

As used herein, the singular "a" and "an" may be construed as including the plural "one or more" unless clearly indicated otherwise.

This disclosure has been presented for purposes of illustration and description but is not intended to be exhaustive or limiting. Many modifications and variations will be apparent to those of ordinary skill in the art. The example embodiments have been chosen and described in order to explain principles and practical application, and to enable others of ordinary skill in the art to understand the disclosure for various embodiments with various modifications as are suited to the particular use contemplated.

Thus, although illustrative example embodiments have been described herein with reference to the accompanying figures, it is to be understood that this description is not limiting and that various other changes and modifications may be effected therein by one of ordinary skill in the art without departing from the scope of the disclosure.

The invention claimed is:

1. An extensible memory subsystem, comprising:
   a dual in-line memory module (DIMM), comprising:
      a dynamic random-access memory (DRAM) having a basic memory space;
      3a DIMM memory controller coupled to the DRAM;
      a memory interface configured to couple the DIMM to a DIMM connector of a computing device; and
      a first extension interface configured to couple the DIMM to a first remote memory module having a first remote memory space, wherein the DIMM memory controller is configured to map a DIMM memory space comprising the basic memory space of the DRAM and the first remote memory space of the first remote memory module, the DIMM memory space accessible by the computing device upon the DIMM being coupled to the computing device via the memory interface, wherein the first extension interface comprises a networking interface circuit configured to couple the DIMM memory controller to the first remote memory module; and
   a first remote memory module coupled to the DIMM via the first extension interface of the DIMM.

2. The extensible memory subsystem of claim 1, wherein the DIMM memory controller is further configured to map a first address to a second address, the first address defined with respect to the DIMM memory space, the second address defined with respect to the first remote memory space.

3. The extensible memory subsystem of claim 1, wherein the first remote memory module further comprises a first remote memory controller configured to define a first remote memory space, the first remote memory controller further configured to map a second address to a third address, the second address determined with respect to the first remote memory space, the second address converted from the first address by the DIMM memory controller.

4. The extensible memory subsystem of claim 3, wherein the DIMM memory controller is configured to provide a memory map, the memory map aggregating the first remote memory space with the basic memory space.

5. The extensible memory subsystem of claim 1, further comprising:
   a second remote memory module defining a second remote memory space, the second remote memory module coupled to the first remote memory module via a second extension interface, wherein the first remote memory module further comprises a first remote memory controller configured to map a second address to a third address, the third address defined with respect to the second remote memory space, the second address determined with respect to the first remote memory space of the first remote memory module, the second address converted from the first address by the DIMM memory controller.

6. The extensible memory subsystem of claim 5, wherein the first remote memory controller is configured to provide a memory map, the memory map aggregating the second remote memory space with the first remote memory space.

7. The extensible memory subsystem of claim 1, further comprising a second extension interface configured to couple to one of the DIMM memory controller or the first remote memory module to a second remote memory module, the second remote memory module comprising a second memory space having a storage space of a hard disk drive.

8. The extensible memory subsystem of claim 5, wherein the second remote memory space comprises a storage space of a solid-state storage device.

9. The extensible memory subsystem of claim 1, further comprising a non-volatile memory (NVM) having an NVM memory space.

10. A memory module comprising:
    a dynamic random-access memory (DRAM) having a DRAM memory space;
    a dual in-line memory module (DIMM) interface configured to couple the DRAM to a computing device;
    a second interface configured to couple to a second memory module, the second memory module comprising a second memory space having a storage space of a hard disk drive; and
    a memory controller configured to:
       map a first memory space, the first memory space comprising the DRAM memory space;
       determine a first address with respect to the first memory space;
       map an aggregated first memory space, the aggregated first memory space comprising the first memory space and the second memory space; and
       map an address between the aggregated first memory space and one of the first memory space and the second memory space.

11. The memory module of claim 10, further comprising an address conversion table storable in the DRAM, the address conversion table configured to map an address between the aggregated first memory space and the second memory space.

12. The memory module of claim 10, wherein the second memory space comprises a memory space of a DRAM device.

13. The memory module of claim 10, wherein the second memory space comprises a storage space of a solid-state storage device.

14. The memory module of claim 10, further comprising a NVM having an NVM memory space.

15. A memory subsystem of a computing device, the memory subsystem comprising:
    a dual inline memory module (DIMM) including:
       a memory interface configured to couple with a system memory controller of the computer device; and
       a DIMM memory controller configured to map a DIMM memory space accessible by the system memory controller through the memory interface; and
    a cascade of remote memory modules, each remote memory module providing a respective remote memory space, wherein the cascade of remote memory modules is coupled to the DIMM,
       wherein the DIMM memory controller determines an accumulation of the respective remote memory spaces and the DIMM memory space, wherein the remote memory space comprises at least one of storage space of a hard disk drive or other storage equipment coupled to the DIMM via a second memory interface having a networking interface circuit.

16. The memory subsystem of claim 15, wherein the accumulation of remote memory spaces is accumulated in a downstream direction such that the remote memory space increases with increasing proximity to the DIMM.

17. The memory subsystem of claim 15, wherein the DIMM memory controller is further configured to map a first address to a second address, the first address defined with respect to the DIMM memory space, the second address defined with respect to a first remote memory space.

18. The memory subsystem of claim 17 wherein a remote memory module of the cascade of remote memory modules further comprises a first remote memory controller configured to define a first remote memory space, the first remote memory controller further configured to map a second address to a third address, the second address determined with respect to the first remote memory space, the second address converted from the first address by the DIMM memory controller.

19. The memory subsystem of claim 15, wherein the remote memory space comprises a memory space of a DRAM device.

20. The memory subsystem of claim 15, wherein the remote memory space comprises a storage space of a solid-state storage device.

* * * * *